United States Patent
Ko

(10) Patent No.: US 7,657,041 B1
(45) Date of Patent: Feb. 2, 2010

(54) LASER AUDIO PREAMPLIFIER, VOLUME CONTROL, AND MULTIPLEXER

(76) Inventor: Jimmy Ko, 1987 Adams Ave., San Leandro, CA (US) 94577-1005

( * ) Notice: Subject to any disclaimer, the term of this patent is extended or adjusted under 35 U.S.C. 154(b) by 954 days.

(21) Appl. No.: 11/132,770

(22) Filed: May 19, 2005

(51) Int. Cl.
*H03F 99/00* (2009.01)
*H01S 3/00* (2006.01)
*H04B 10/12* (2006.01)

(52) U.S. Cl. .................. 381/120; 398/140; 359/337.13; 359/337.4

(58) Field of Classification Search .................. 381/77, 381/79, 111, 113, 116, 118, 120, 124; 359/337, 359/337.1, 337.13, 337.4, 285, 286; 398/25, 398/33, 115–116, 132–134, 140–142
See application file for complete search history.

(56) References Cited

U.S. PATENT DOCUMENTS

| | | | | |
|---|---|---|---|---|
| 4,945,806 | A * | 8/1990 | Merrill, Jr. .................. | 84/645 |
| 5,483,367 | A * | 1/1996 | Han .......................... | 398/115 |
| 5,564,942 | A | 10/1996 | Lee .......................... | 439/462 |
| 5,602,669 | A * | 2/1997 | Chaki ........................ | 398/188 |
| 5,676,565 | A | 10/1997 | Vagnoni ..................... | 439/580 |
| 5,815,298 | A * | 9/1998 | Cern .......................... | 398/16 |
| 6,025,946 | A * | 2/2000 | Miyamori et al. ............ | 398/185 |
| 6,353,169 | B1 | 3/2002 | Juszkiewicz et al. .......... | 84/600 |
| 6,373,622 | B1 * | 4/2002 | Kosaka .................. | 359/337.13 |
| 6,389,139 | B1 | 5/2002 | Curtis et al. ................ | 381/105 |
| 6,490,063 | B1 | 12/2002 | Imajo ......................... | 398/13 |
| 6,833,948 | B2 * | 12/2004 | Chen et al. ............... | 359/337.1 |
| 7,072,475 | B1 * | 7/2006 | DeNap et al. ................ | 381/74 |
| 7,327,919 | B1 * | 2/2008 | Ko .............................. | 385/101 |
| 7,330,651 | B2 * | 2/2008 | Yamashita .................... | 398/25 |
| 7,493,049 | B1 * | 2/2009 | Conemac .................... | 398/141 |
| 2003/0035556 | A1 | 2/2003 | Curtis et al. ................ | 381/105 |

OTHER PUBLICATIONS

"A Digital Multiplexed fiber Optic Transmission System For Analog Audio Signals", Lee et al., WESCAMEX '91 IEEE Western Canada, Conf. on Computer, Power +Comm. Sys. in Rural Environment, May 30, 1991, pp. 146-149.
"Fiber Optic Link For Digital Audio Interface", Sakura, et al., IEEE Trans. on Consumer Elec., Aug. 1988, pp. 667-670, vol. 4, Issue 3.
Co-pending U.S. Appl. No. 10/877,594, filed Jun. 25, 2004, "A Fiber Optic Audio Cable", assigned to the same assignee.

* cited by examiner

*Primary Examiner*—Xu Mei
(74) *Attorney, Agent, or Firm*—Saile Ackerman LLC; Stephen B. Ackerman; Billy Knowles

(57) ABSTRACT

A fiber optical audio preamplifier receives audio signals from an audio source, amplifies the audio signals, and transfers the signals to a power amplifier. The fiber optical audio preamplifier has at least one first signal converter. Each first signal converter acquires one audio signal from one audio source and converts the audio signal to a modulated light signal. At least one fiber optic volume control device that includes a variable optical attenuator that is connected to receive the modulated light signal. A control signal for sets an attenuation factor of the variable optical attenuator for attenuating the modulated light signal to control volume of the audio signal. One second signal converter is in communication with each fiber optic volume control device to receive the attenuated modulated light signal and demodulate the attenuated modulated light signal to recover the audio signal for transmission to the power amplifier.

35 Claims, 5 Drawing Sheets

LASER AUDIO PREAMPLIFIER, VOLUME CONTROL, AND MULTIPLEXER

BACKGROUND OF THE INVENTION

1. Field of the Invention

This invention relates generally to sound reproduction systems. More particularly, this invention relates to preamplification devices that receive audio signals from sound generation sources such as compact disc players, digital video disk players, microphones, and acoustic pickups or transducers on musical instruments, amplify the audio signals for transfer to a power amplifier and then to a speaker for sound reproduction. Even more particularly, this invention relates to the preamplification of audio signals by way of an optical preamplification device.

2. Description of Related Art

Audio/Visual systems such as home entertainment systems or sound reproduction systems for theaters and auditoriums must transfer audio and/or video signals from sound and video generation equipment to speakers or video displays. The sound generation equipment is often connected to a preamplifier. The audio signals from the sound generation equipment often has a very low amplitude, which, if transmitted for relatively long distances on a cable, would be highly attenuated and distorted. To compensate for this attenuation, the preamplifier amplifies and conditions the audio signal for transmission of the audio signal on a cable to a power amplifier. The preamplified audio signal can then be transmitted on a cable to the power amplifier. It is more desirable to transmit the audio signal from preamplifier to the power amplifier for longer distances. The power amplifier being closer to the sound reproduction transducers or speakers to minimize losses in the cables. Further, a preamplifier selects an input audio signal from multiple audio sources; controls output volume level; adjusts (amplify or attenuate) the output signal level to the optimal level for the input of power amplifier. A good preamplifier must have a broad range of frequency response, so the source signal won't be degraded.

One of the most common connector utilized for connecting audio and video systems, is what is commonly referred to as an "RCA" connector, variations of which are described in U.S. Pat. Nos. 5,564,942 (Lee) and 5,676,565 (Vagnoni). The "RCA" connector consists of a cylindrical member adapted for connection at one end to a cable and having a pin and a contact, or ground, sleeve projecting from the other end. The pin engages in a corresponding socket in a terminal, or jack, to form the "positive" connection. The contact sleeve extends over a cylindrical flange of the jack in an interference fit to form the "negative", or ground, connection. As a result, current can flow to the audio/visual reproduction devises from the audio/visual generation equipment connected to the other end of a cable connected between two of the "RCA" connectors. The "RCA connector" is a common term that is also referred to commonly as "audio jack connectors", "phono-connectors", and the like.

Audio/visuals systems used in theaters, auditoriums, and recording studios generally use a three-pin XLR connector such as those manufactured by ITT Industries, Cannon, Santa Ana, Calif., 92705-5612. These audio/visual systems commonly utilize a "balanced" circuit that requires two signal conductors. The XLR connector incorporates from two to seven contacts and a shielding to provide a ground referencing for the cabling.

In auditorium and theaters, the cables from the preamplier may very long distances (>10 meters). At this great a distance from the speakers or the video displays, the signal quality is degraded. Electronic noise from induced spurious electronic signals, from ground differentials, and from the electrical characteristics of the cables themselves contributes to the lower quality signal. This limits the distance of that the audio and/or video generation devices are from the speakers and/or the video displays.

"A Digital Multiplexed Fiber Optic Transmission System for Analog Audio Signals", Lee, et al., WESCANEX '91' IEEE Western Canada Conference on Computer, Power and Communications Systems in a Rural Environment, May 30, 1991, pp.: 146-149, provides for distribution of multiple high-fidelity audio signals over distances up to several kilometers in commercial and institutional settings. A fiber-optic system for six channels employs time division multiplexing to transmit six audio signals over a single optical fiber. The transmission circuitry is simplified by the use of a second fiber to transmit the system clock frequency.

"Fiber Optic Link For Digital Audio Interface", Sakura, et al., IEEE Transactions on Consumer Electronics, August 1988, pp.: 667-670, Volume: 4, Issue: 3, describes a fiber optic link for digital audio interfaces that is able to transmit 3 Mb/s biphase signals up to 10 m with the pulse-width distortion at less than + or −25 ns.

U.S. Pat. No. 6,389,139 (Curtis, et al.) describes a powered volume control for distributed audio system for multiple remote speakers. An amplifier or signal conditioner is provided having a dual channel amplified signal from a high impedance source. The amplified or conditioned signal is provided to a plurality of remotely located powered volume controls having high input impedance and further having internal amplifiers which provide a dual or mono-channel amplified signal having an amplitude or magnitude determined by a user variable adjustment device. The amplified signal is then provided to one or more remote speakers. Each volume control is designed for in-wall installation in a single-gang wall box and may be covered by an ornamental face plate. The system is also designed to utilize existing four conductor speaker wire for installation or retrofitting existing distributed audio systems.

U.S. Pat. No. 6,353,169 (Juszkiewicz, et al.) teaches an audio communications and control system that includes a plurality of audio devices each of which includes a device interface module for communication of digital audio data and control data from at least one of the devices to at least one other of the devices. A universal data link is operatively connected to each of the device interface modules. The device interface modules and universal data links are operative in combination to connect the devices together in the system and provide full duplex communication of the digital audio data and control data between the devices.

U.S. Patent Application 2003/0035556 (Curtis, et al.) provides an audio distribution system is provided for communicating audio signals between one or more audio sources and a plurality of remote speakers. The system includes at least one audio source for generating an audio signal, and amplified volume controls placed remotely from the audio source. The volume controls are operative to receive and amplify the audio signal to power associated speakers. A power supply is also placed remotely from one or more of the volume controls, for generating a power supply to power all volume controls. An audio/power distribution network is connectable to the audio source, power supply and volume controls, for communicating the audio signal and power supply signal throughout the network. A plurality of audio/power distribution nodes are connected to the audio/power distribution network for interfacing the audio source, power supply and volume controls to the distribution network. The power supply and audio source may be connected to any of the distribution nodes to provide audio signal and power to each of the volume controls.

SUMMARY OF THE INVENTION

An object of this invention is to provide an optical preamplification device that receives audio signals from an audio source, amplifies the audio signals, and transfers the signals to a power amplifier.

Another object of this invention is to provide an optical preamplfication device that selects an input audio signal from multiple audio sources. Further, another object of this invention is to provide an optical preamplification device that controls the output volume level of audio signals transferred to a power amplifier.

Still further, another object of this invention is to provide an optical preamplfication device that adjusts (amplifies or attenuates) the output signal level of the optical preamplfication device to the optimal level for an input of a power amplifier.

Even still further, another object of this invention is to provide an optical preamplfication device that has a broad range of frequency response to prevent degradation of a source signal.

To accomplish at least one of these objects, a fiber optical audio preamplifier has at least one first signal converter. Each first signal converter acquires one audio signal from one audio source and modulates a light signal to generate a modulated light signal. The fiber optical audio preamplifier has at least one fiber optic volume control device. Each fiber optic volume control device includes a variable optical attenuator that is connected to receive the modulated light signal. The variable optical attenuator receives a control signal for setting an attenuation factor of the variable optical attenuator to attenuate the modulated light signal to control volume of the audio signal. One second signal converter is in communication with each fiber optic volume control device to receive the attenuated modulated light signal and demodulate the attenuated modulated light signal to recover the audio signal for transmission to the power amplifier.

At least one first audio connector is connected to receive the audio signal for transfer to the first signal converter. Similarly, at least one second audio connector is connected to receive the demodulated audio signal for transfer to the power amplifier. The first and second audio connectors maybe RCA audio connectors, BNC connectors or XLR audio connectors.

The fiber optical audio preamplifier has at least one multiplexer. Each multiplexer is in communication with two or more of the first signal converters to receive the modulated light signal from each of the signals converters. The multiplexer receives a first selection signal that selects which of the modulated light signals of the signal converters are to be transmitted to the fiber optic volume control device.

The fiber optical audio preamplifier further has at least one demultiplexer. Each demultiplexer is in communication with one of the fiber optic volume control devices to receive the attenuated modulated light signal from the fiber optic volume control devices. The de-multiplexer receives a second selection signal that selects which of the second signal converters to which the attenuated modulated light signals from the fiber optic volume control device is to be transferred.

A preamplifier controller is in communication with the fiber optic volume control device, the multiplexers, and the de-multiplexers to provide the control signals for transmitting the attenuation factor, the first selection signal for selecting the modulated signals, the second selection signal for selecting the second converter to which the attenuated modulated light signal is to be transferred.

The first signal converter includes a modulator and an electron-to-light converter. The modulator receives the analog signal and converts it to a conversion current proportional to analog signal. The electron-to-light converter is in communication with the modulator to receive the conversion current to generate said modulated light signal. The electron-to-light converter is a light emitting diode or a laser diode.

The second signal converter includes a light-to-electron converter and a demodulator. The light-to-electron converter receives the attenuated modulated light signal and converts the attenuated modulated light signal to a current that varies with the modulated carrier signal. The demodulator is in communication with the light-to-electron converter to receive the current and remove the carrier signal to reconvert the audio signal for transfer to the power amplifier. The light-to-electron converter is a photoresistor, phototransistor, or photodiode.

BRIEF DESCRIPTION OF THE DRAWINGS

FIG. 2b is a diagram of an audio cable assembly with RCA audio connectors incorporated in the audio reproduction system of this invention of FIG. 2a.

FIG. 2c is a diagram of an audio cable assembly with BNC connectors incorporated in the audio reproduction system of this invention of FIG. 2a.

FIG. 2d is a diagram of an audio cable assembly with XLR audio connectors in incorporated the audio reproduction system of this invention of FIG. 2a.

DETAILED DESCRIPTION OF THE INVENTION

Figure 1:
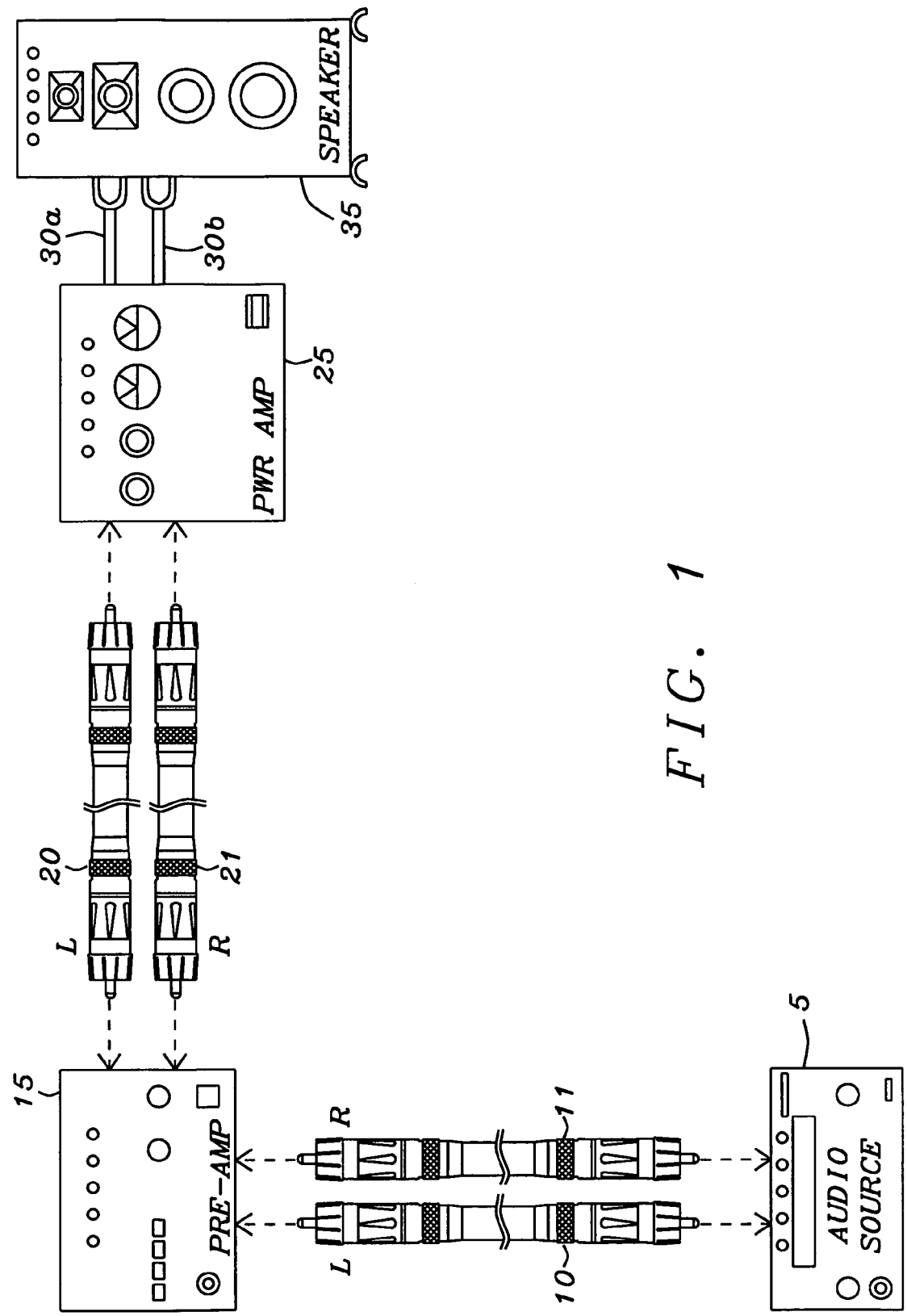
FIG. 1 is a block diagram of an audio reproduction system of this invention.

An audio system of this invention, as shown in FIG. 1, has sound generation or audio sources 5 such as compact disc, digital video disk players, microphones, and acoustic pickups or transducers on musical instruments that create low level audio signals. These audio signals are transferred through the cable assemblies 10 and 11 to the preamplifier 15. The preamplifier 15 of this invention has an electron-to-light converter to convert the low level audio signals to modulated light signals, attenuates the level of the modulated light signals to adjust the volume of the audio signals in a fiber optic volume control device and reconverts the attenuated modulated light signals to electrical signals for transfer through the cables 20 and 21. The reconverted audio signals are then transferred to the power amplifier 25 for amplification and conditioning to drive the speakers 35 through the speaker wiring 30a and 30b.

The conversion of the audio signals to modulated light signals isolates the audio generation sources 5 and the preamplifier 15 electrically from the power amplifier 35 to prevent electronic noise from induced spurious electronic signals, from ground differentials, and from the electrical characteristics of the cables themselves from contributing to lower quality audio signals.

Referring now to FIG. 2 for a description of the structure of the preamplifier 15 of this invention. The audio source 5 of FIG. 1 may in fact be multiple audio sources 5a, ..., 5n, as shown. Each of the multiple audio sources 5a, ..., 5n will have receiving panel connectors to receive the connectors of the cables 10a, 10n and 11a, ..., 11n. The connectors of the cables 10a, ..., 10n and 11a, 11n may be RCA audio connectors as shown in FIG. 2b, BNC connectors as shown in FIG. 2c, or XLR audio connectors as shown in FIG. 2d. The receiving panel connectors of the multiple audio sources 5a, ..., 5n may be RCA audio connectors, BNC connectors, or XLR audio connectors as illustrated by the connectors of the cables 10a, ..., 10n and 11a, ..., 11n of FIGS. 2b-2d. The connectors of the cables 10a, ..., 10n and 11a, ..., 11n are connected through the panel connectors 16a, 16b, ..., 16y, and 16z, 17a, 17b, ..., 17y, and 17z, and 19a, 19b, ..., 19y, and 19z to the input laser analog input modules 100a, ..., 100z. The input laser analog input modules 100a, ..., 100z convert the low level audio signals to the modulated light signals.

Figure 3A:
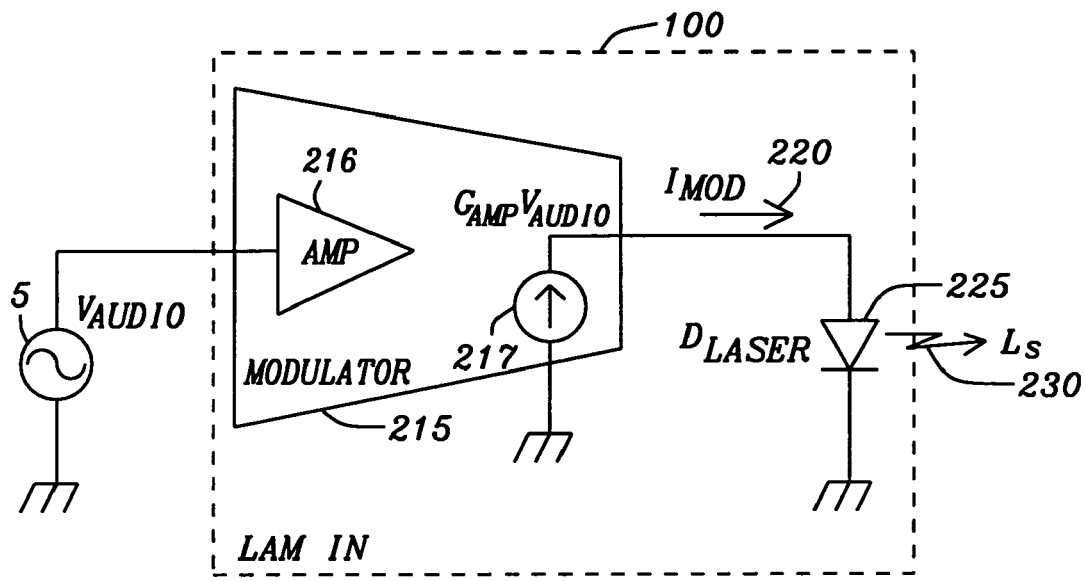
FIGS. 3a and 3b are schematic diagrams of the laser analog input and output modules of the preamplifier of this invention.
Figure 4A:
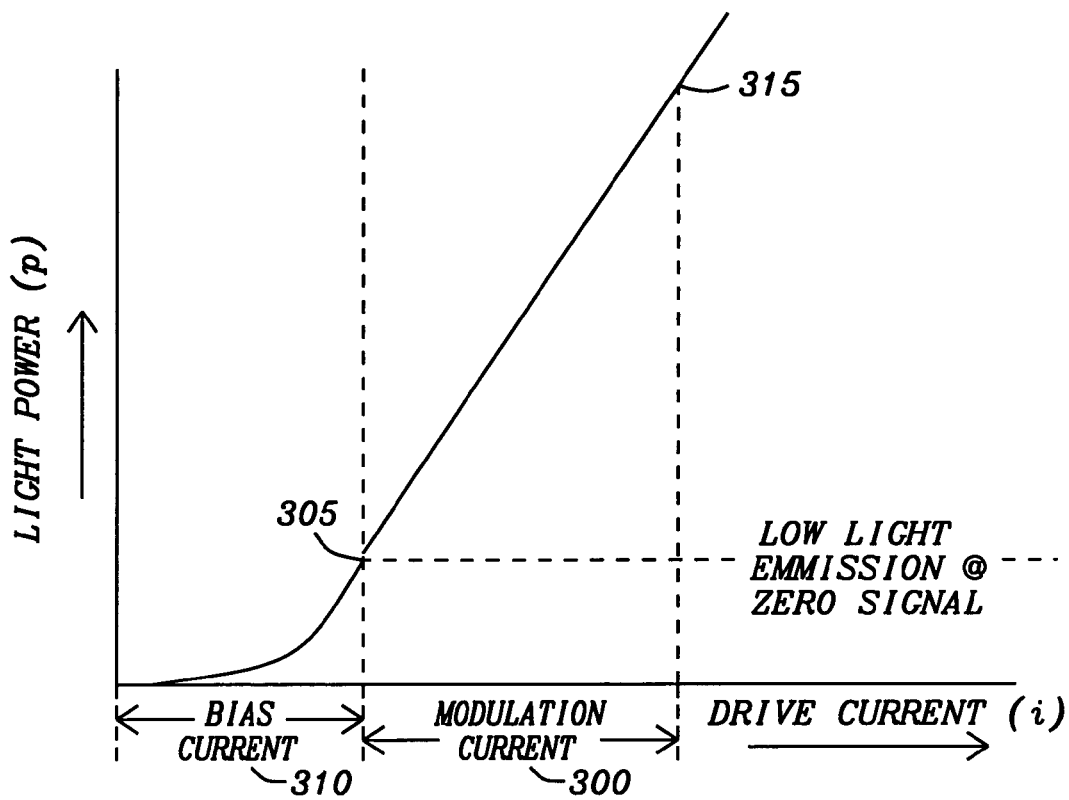
FIG. 4a is a plot of the input current versus output light intensity of the laser diode of the laser analog input modules of the preamplifier of this invention.

The configuration of the input laser analog input modules 100a, ..., 100z is shown in FIG. 3a. The audio signal $V_{AUDIO}$ 5 is transferred from the generation device through the cables 10a, ..., 10n and 11a, ..., 11n to the panel connectors 16a, 16b, ..., 16y, and 16z, 17a, 17b, ..., 17y, and 17z, and 19a, 19b, ..., 19y, and 19z that are connected to the laser analog input module 100 for the transfer of the audio signal $V_{AUDIO}$ 5 to the laser analog input module 100. The laser analog input modules 100 have a modulator 215 which receives the audio signal $V_{AUDIO}$ 5 at the input amplifier AMP 216. The current source 217 develops the modulation current $I_{MOD}$ 220 that is proportional to the voltage level of the audio signal $V_{AUDIO}$ 5 ($G_{AMP} V_{AUDIO}$). The modulation current $I_{MOD}$ 220 passes through the light emitting devices such as a light emitting diode or a laser diode $D_{LASER}$ 225. The modulation current $I_{MOD}$ 220 determines the magnitude or power of the light emitted by the laser diode $D_{LASER}$ 225 thus generating a photon density modulated light signal 230 Referring to FIG. 4a, the preferred embodiment of the laser analog input module 100 uses a laser diode $D_{LASER}$ 225. The plot of FIG. 4a illustrates the power of magnitude of the light emitted by a laser diode versus the drive current (i). While laser diodes are not entirely linear over their range of operation, a range of modulation current 300 causes an essentially linear range of light power or light intensity (p). At lower levels of drive current (t) the light power (p) is nonlinear. The laser diode $D_{LASER}$ 225 must then have a bias current 310 applied when the audio signal $V_{AUDIO}$ 5 has zero magnitude. A the upper ranges 315 of the drive current (i), the light power (p) again begins to be less linear and will distort any extremes in magnitude of the modulated light signal $L_s$ 230. The modulated light signal $L_s$ 230 is transferred from the laser analog input module 100.

Referring back to FIG. 2a, the light signals (230 of FIG. 3a) at the outputs of the laser analog input modules 100a, ..., 100z are transferred to the multiplexers 105a and 105b. The preamplifier controller 130 provides a source selection signal 126 to the multiplexers 105a and 105b to determine which of the multiple audio sources 5a, ..., 5n are to provide the analog signals for preamplification.

The multiplexers 105a and 105b in the preferred embodiment are optical switches such as the LT500 or LT900 series optical switches from LightTech Fiberoptics, Inc., San Leandro, Calif. (found www.Lightech.net, Mar. 3, 2005). The number of sources acceptable to the switches 105a and 105b is determined by the number of multiple audio sources 5a, ..., 5n that the preamplifier 15 may accept.

The multiplexers 105a and 105b are connected to the preamplifier controller 130 that provides appropriate selection signals that determine the desired audio source of the multiple audio sources 5a, ..., 5n. The multiplexers 105a and 105b accept the selected audio signals from the desired audio source 5a, ..., 5n for transfer to the variable optical attenuators 110a and 110b. The variable optical attenuators 110a and 110b are set to a desired attenuation factor to provide adjustment of the amplitude of the modulated light signal to provide the preamplification of the audio signal from the selected audio sources 5a, 5n. The variable optical attenuators 110a and 110b are structured as those known in the art and exemplified by the LT450 variable optical attenuator from LightTech Fiberoptics, Inc. (found www.Lightech.net, Mar. 3, 2005).

The preamplifier controller 130 provides an attenuation control signal 128 defining the attenuation factor required to adjust the volume of the audio signal to be transferred to the power amplifier 25. The output of the variable optical attenuators 110a and 110b are respectively connected to the fiber optical cables 115a and 115b.

The fiber optical cables 115a and 115b are connected to the demultiplexers 120a and 120b. The demultiplexers 120a and 120b determine which of the RCA panel connectors 22a and 22b, the BNC panel connector, 24a and 24b, or the XLR panel connector 26a and 26b are to receive the recovered audio signal. The demultiplexers 120a and 120b in the preferred embodiment are optical switches such as the LT200, LT500, or LT900 series optical switches from LightTech Fiberoptics, Inc., San Leandro, Calif. (found www.Lightech.net, Mar. 3, 2005).

The preamplifier controller 130 generates a second selection signal 127 that indicates which of the connector types—the RCA panel connectors 22a and 22b, the BNC panel connector, 24a and 24b, or the XLR panel connector 26a and 26b are to be selected. The light signals from the fiber optical cables 115a and 115b are transferred through the demultiplexers 120a and 120b to the output laser analog output modules 125a, ..., or 125z. The selected output laser analog output modules 125a, ..., or 125z convert the attenuated modulated light signals to recovered audio signal for transfer through the appropriate panel connectors 22a and 22b, 24a and 24b, or 26a and 26b to the cables 20 and 21 to the power amplifier 25.

While the multiplexers 105a and 105b and the demultiplexers 120a and 120b are preferably are optical switches as described above, the multiplexers 105a and 105b and the demultiplexers 120a and 120b, in a second embodiment, are 1 XN optical splitters (also referred to as optical couplers). Exemplary optical splitters are the APSPL planar optical splitters/couplers from ANDevices, Fremont, Calif. 94538 (found www.andevices.com, Mar. 3, 2005) or Single Mode Single Window Couplers from LightTech Fiberoptics, Inc. (found www.Lightech.net, Mar. 3, 2005).

Figure 3B:
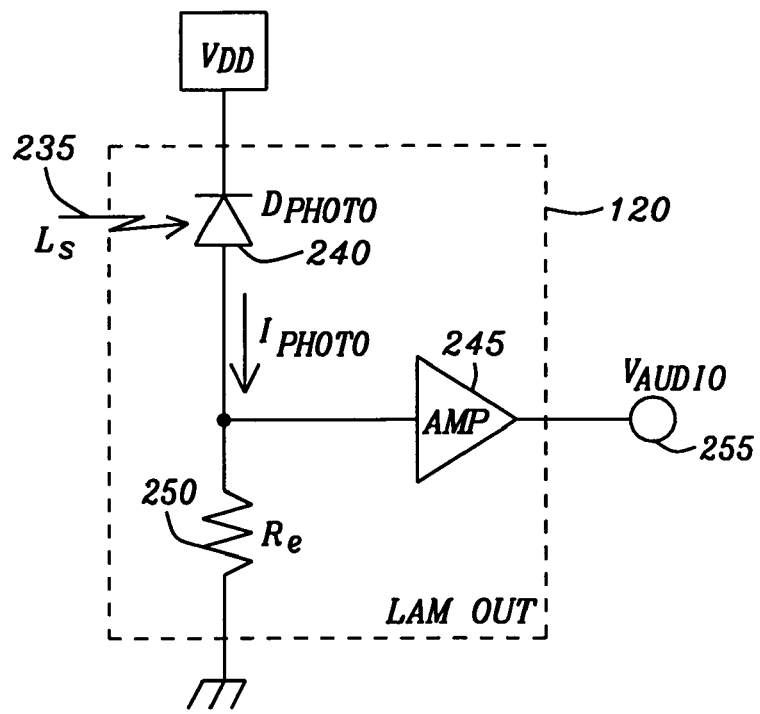

Refer now to FIG. 3b for a description of the structure and operation of the selected output laser analog output modules 125a, ..., 125z. The attenuated photon density modulated light signal 235 is transferred through the fiber optic cable 115a and 115b of FIG. 2a to the selected output laser analog output module 120 to a photo-conversion device such as the photodiode $D_{PHOTO}$ 240. Alternate photo-conversion devices maybe photo-resistors or photo-transistors. The photodiode $D_{PHOTO}$ 240 is aligned to receive the photon density modulated light signal 235 from the fiber optic cable. The magnitude of a current through the photodiode $D_{PHOTO}$ 240 being dependent upon the magnitude of the photon density modulated light signal 235. The current $I_{PHOTO}$ through the photodiode $D_{PHOTO}$ 240 develops a voltage at the resistor $R_e$ 250 to generate the input signal to an amplifier 245 which amplifies and conditions the input signal to create a recovered version of the modulating audio signal 255 at the output of the amplifier. Since the audio signal 5 of FIG. 3a is directly modulating the photon density of the light signal $L_s$ 235, the photon to electron conversion within the photodiode $D_{PHOTO}$ 240 acts as the demodulation device to recover the audio signal as variations in the current $I_{PHOTO}$.

Figure 4B:
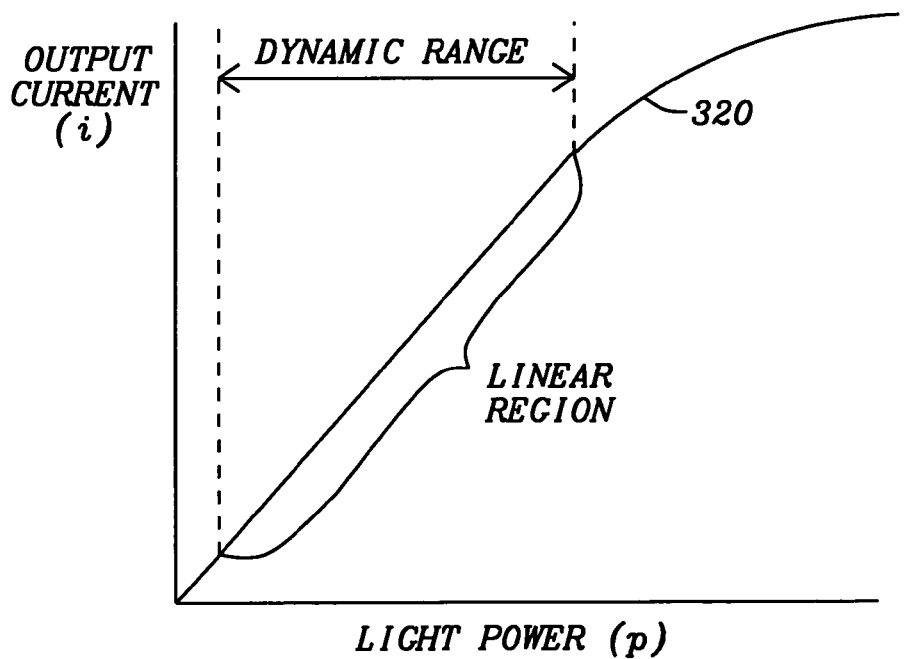
FIG. 4b is a plot of the input light intensity versus output current of the photo diode of the laser analog output modules of the preamplifier of this invention.

Referring to FIG. 4b, the plot 320 shows the dependency of the output current (i) developed as a function of the photon density or light power (p) impinging upon the photodiode $D_{PHOTO}$ 240. The output current (i) is generally nonlinear versus the light power (p), but certain regions of the light power (p). However, if the light power (p) is chosen to be in the linear region, the audio signal can be recovered with little or no distortion.

Figure 2A:
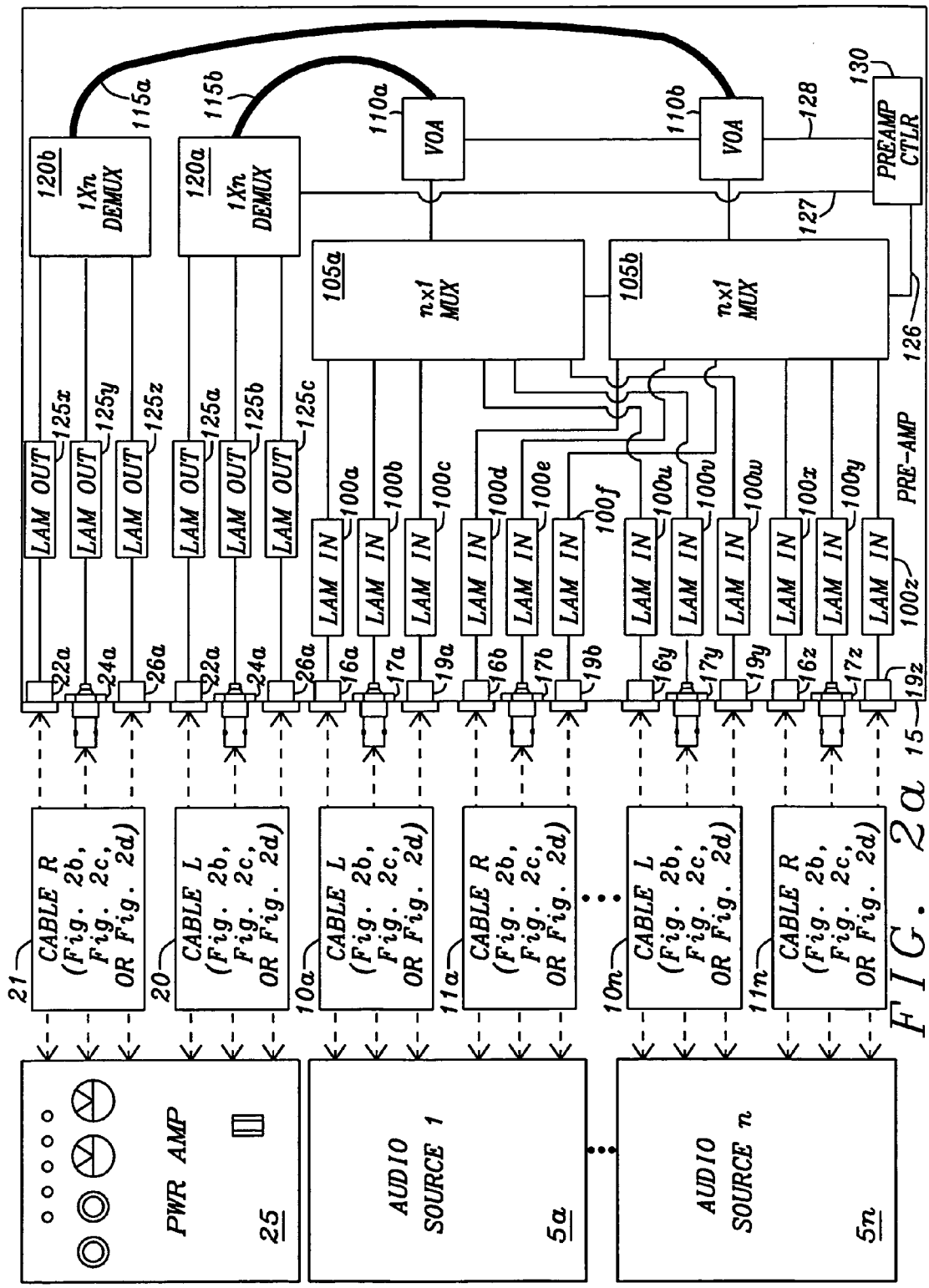
FIG. 2a is a diagram of the audio reproduction system of FIG. 1 showing the structure of the preamplifier of this invention.
Figure 2B:
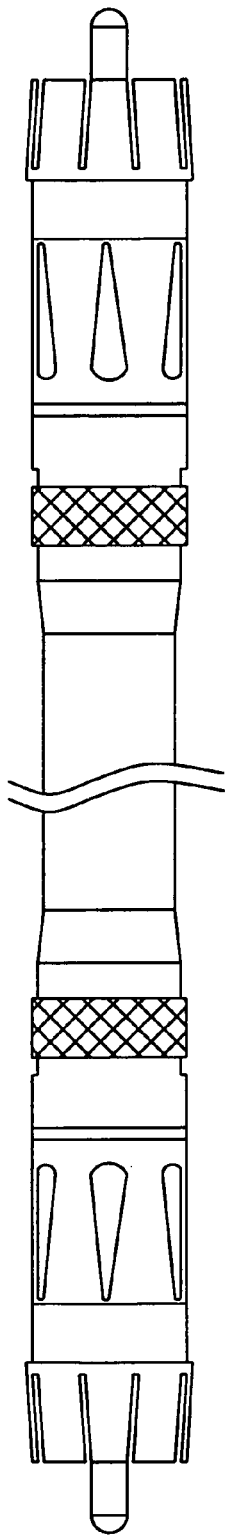
Figure 2C:
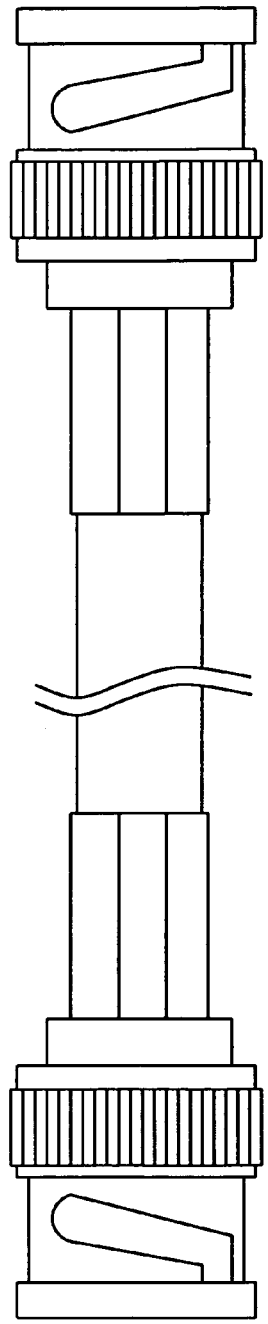
Figure 2D:
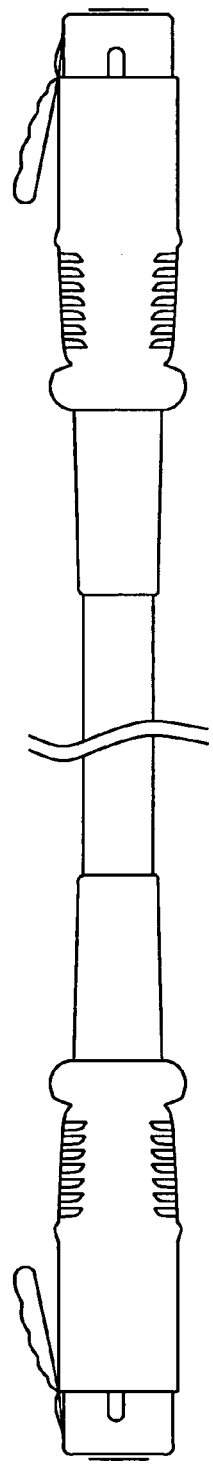

Returning to FIG. 2a, the laser analog output modules 125a, . . . , or 125z are connected to the RCA panel connectors 22a and 22b, the BNC panel connector, 24a and 24b and the XLR panel connector 26a and 26b. The cables 20 and 21 are in their respective panel connectors 22a and 22b, 24a and 24b, or 26a and 26b and inserted to a mating receiving connectors in the power amplifier 25 of FIG. 2a. The cable assemblies 20 and 21 may be RCA audio connectors as shown in FIG. 2b, BNC connectors as shown in FIG. 2c, or XLR audio connectors as shown in FIG. 2d. The recovered audio signal 255 of FIG. 3b is transferred to the power amplifier 25 and thence to the speaker 35 for reproduction.

In summary this invention provides an apparatus that executes a method for optically preamplifying at least one audio signal that is received from at least one audio source, amplifying the audio signal and transmitting the audio signal to a power amplifier. The method for optically preamplifying audio signals begins by acquiring each of the audio signals from the audio sources. The audio signals modulate light signals as described in FIG. 3a. The modulated light signal is optically adjusted to regulate the volume of the audio signal. The optical adjustment of the modulated light signal is accomplished by a provided fiberoptic volume control device such as variable optical attenuator. A control signal is received by the variable optical attenuator for setting an attenuation factor of the variable optical attenuator to attenuate the modulated light signal to control volume of the audio signal. The attenuated modulated light signal is converted to a modulated carrier signal which is then demodulated to recover the audio signal. The recovered demodulated audio signal is then transmitted to the power amplifier.

The method for optically preamplifying at least one audio signal further includes receiving a first selection signal containing a selection which of two or more the modulated light signals. From the first selection signals, one of the two or more the modulated light signals are selected for optical adjustment of the volume.

The method for optically preamplifying further includes receiving a second selection signal that selects which of the second signal converters to which the attenuated modulated light signals from the fiber optic volume control device is to be transferred. From the second selection signal, the attenuated modulated light signal is transferred to a selected second signal converter and thence to the power amplifier.

While this invention has been particularly shown and described with reference to the preferred embodiments thereof, it will be understood by those skilled in the art that various changes in form and details may be made without departing from the spirit and scope of the invention.

The invention claimed is:

1. A fiber optical analog signal preamplifier that receives at least one analog signal from a plurality of analog sources, amplify said analog signals and transmit said analog signals to a power amplifier, said fiber optical analog preamplifier comprising:
    a plurality of first signal converters, each first signal converter acquiring said analog signal from each analog source and modulating a light signal to generate a modulated light signal;
    a plurality of fiber optic amplitude control devices, each fiber optic amplitude control device comprising a variable optical attenuator connected to receive said modulated light signal from at least one of said first signal converters, said variable optical attenuator receiving a control signal for setting an attenuation factor of said variable optical attenuator to attenuate said modulated light signal to control amplitude of said analog signal; and
    a plurality of second signal converters, said second signal converter in communication with said fiber optic amplitude control device to receive said attenuated modulated light signal and convert said attenuated modulated light signal to an electrical signal and from said electrical signal, recover said analog signal for transmission to said power amplifier; and
    at least one multiplexer in communication with two or more of said first signal converters to receive said modulated light signals from each of said signals converters, said multiplexer receiving a first selection signal that selects which of said modulated light signals of the signal converters are to be transmitted to said fiber optic amplitude control device.

2. The fiber optical analog preamplifier of claim 1 further comprising:
    at least one first analog connector, said first analog connector connected to receive said analog signal for transfer to said first signal converter.

3. The fiber optical analog preamplifier of claim 1 further comprising:
    at least one second analog connector, said first analog connector connected to receive said demodulated analog signal for transfer to said power amplifier.

4. The fiber optical analog preamplifier of claim 1 further comprising:
    at least one demultiplexer, each demultiplexer in communication with at least two of said fiber optic amplitude control devices to receive said attenuated modulated light signal from each of said fiber optic amplitude control devices, said de-multiplexer receiving a second selection signal that selects which of said second signal converters to which said attenuated modulated light signals from said fiber optic amplitude control device is to be transferred.

5. The fiber optical analog preamplifier of claim 4 further comprising:
    a preamplifier controller in communication with said fiber optic amplitude control devices, said multiplexers, and said de-multiplexers to provide said control signal for transmitting said attenuation factor, said first selection signal for selecting said modulated signals, said second selection signal for selecting said second converter to which said attenuated modulated light signal is to be transferred.

6. The fiber optical analog preamplifier of claim 2 wherein said first analog connector is selected from a set of analog connectors consisting of an RCA audio connector, a BNC coaxial connector, and an XLR audio connector.

7. The fiber optical analog preamplifier of claim 3 wherein said second analog connector is selected from a set of analog connectors consisting of an RCA audio connector, a BNC coaxial connector, and an XLR audio connector.

8. The fiber optical analog preamplifier of claim 1 wherein each of the first signal converters comprises:
 a modulator that receives said analog signal and converts it to a conversion current proportional to analog signal; and
 an electron-to-light converter in communication with the modulator to receive said conversion current to generate said modulated light signal.

9. The fiber optical analog preamplifier of claim 7 wherein each of said electron-to-light converters is a light emitting diode or a laser diode.

10. The fiber optical analog preamplifier of claim 1 wherein each of said second signal converters comprises:
 a light-to-electron converter to receive said attenuated modulated light signal and convert said attenuated modulated light signal to a current that varies with said modulated carrier signal;
 a demodulator in communication with the light-to-electron converter to receive said current, said demodulator removing said carrier signal to reconvert said analog signal for transfer to said power amplifier.

11. The signal fiber optical analog preamplifier of claim 9 wherein each of the light-to-electron converter is selected from the group of light-to-electron converters consisting of photoresistors, phototransistors, and photodiodes.

12. The fiber optical analog preamplifier of claim 1 wherein said analog signal is an audio signal.

13. A fiber optical audio preamplifier that receives at least one audio signal from a plurality of audio source, amplify said audio signals and transmit said audio signals to a power amplifier, said fiber optical audio preamplifier comprising:
 a plurality of first signal converters, each first signal converter acquiring one audio signal from one audio source and said audio signal modulating a light signal to generate a modulated light signal;
 a plurality of fiber optic volume control device, each fiber optic volume control device comprising a variable optical attenuator connected to receive said modulated light signal from at least one of said first signals converters, said variable optical attenuator receiving a control signal for setting an attenuation factor of said variable optical attenuator to attenuate said modulated light signal to control volume of said audio signal; and
 a plurality of second signal converters, each of said second signal converters in communication with one of said fiber optic volume control devices to receive said attenuated modulated light signal and demodulate and convert said attenuated modulated light signal to an electrical signal and from said electrical signal, recover said audio signal for transmission to said power amplifier; and
 at least one multiplexer in communication with two or more of said first signal converters to receive said modulated light signals from each of said signals converters, said multiplexer receiving a first selection signal that selects which of said modulated light signals of the signal converters are to be transmitted to said fiber optic volume control device.

14. The fiber optical audio preamplifier of claim 13 further comprising:
 at least one first audio connector, said first audio connector connected to receive said audio signal for transfer to said first signal converter.

15. The fiber optical audio preamplifier of claim 13 further comprising:
 at least one second audio connector, said first audio connector connected to receive said demodulated audio signal for transfer to said power amplifier.

16. The fiber optical audio preamplifier of claim 13 further comprising:
 at least one demultiplexer, each demultiplexer in communication with one of said fiber optic volume control devices to receive said attenuated modulated light signal from said fiber optic volume control devices, said demultiplexer receiving a second selection signal that selects which of said second signal converters to which said attenuated modulated light signals from said fiber optic volume control device is to be transferred.

17. The fiber optical audio preamplifier of claim 16 further comprising:
 a preamplifier controller in communication with each of said fiber optic volume control devices, said multiplexers, and said de-multiplexers to provide said control signal for transmitting said attenuation factor, said first selection signal for selecting said modulated signals, said second selection signal for selecting said second converter to which said attenuated modulated light signal is to be transferred.

18. The fiber optical audio preamplifier of claim 14 wherein said first audio connector is selected from a set of audio connectors consisting of an RCA audio connector, a BNC coaxial connector, and an XLR audio connector.

19. The fiber optical audio preamplifier of claim 15 wherein said second audio connector is selected from a set of audio connectors consisting of an RCA audio connector, a BNC coaxial connector, and an XLR audio connector.

20. The fiber optical audio preamplifier of claim 13 wherein each of the first signal converters comprises:
 a modulator that receives said audio signal and converts it to a conversion current proportional to said audio signal; and
 an electron-to-light converter in communication with the modulator to receive said conversion current to generate said modulated light signal.

21. The fiber optical audio preamplifier of claim 20 wherein said electron-to-light converter is a light emitting diode or a laser diode.

22. The fiber optical audio preamplifier of claim 13 wherein each of said second signal converters comprises:
 a light-to-electron converter to receive said attenuated modulated light signal and convert said attenuated modulated light signal to a current that varies with said modulated carrier signal;
 a demodulator in communication with the light-to-electron converter to receive said current, said demodulator removing said carrier signal to reconvert said audio signal for transfer to said power amplifier.

23. The signal fiber optical audio preamplifier of claim 22 wherein each of the light-to-electron converters is selected from the group of light-to-electron converters consisting of photoresistors, phototransistors, and photodiodes.

24. A method for optically preamplifying a plurality of one audio signals that are received from a plurality of audio sources, amplifying said audio signals and transmitting said audio signals to a power amplifier, said method for optically preamplifying audio signals comprising the steps of:

acquiring each of said audio signals from said audio sources;

modulating light signals with each of said audio signals to generate modulated light signals;

receiving a first selection signal containing a selection of said modulated light signals; and selecting one said modulated light signals for optical adjustment of said volume;

optically adjusting volume of said selected audio signal by the steps of providing a variable optical attenuator, connecting said variable optical attenuator to receive said modulated light signal, and connecting said variable optical attenuator to receive a control signal for setting an attenuation factor of said variable optical attenuator to attenuate said modulated light signal to control volume of said audio signal;

converting said attenuated modulated light signal to a modulated carrier signal; and demodulating said modulated carrier to recover said audio signal;

transmitting said demodulated audio signal to said power amplifier.

25. The method for optically preamplifying at least one audio signal of claim 24 wherein acquiring said audio signal comprises the step of:

providing at least one first audio connector, said first audio connector connected to acquire said audio signal.

26. The method for optically preamplifying at least one audio signal of claim 24 wherein acquiring said audio signal comprises the step of:

providing at least one second audio connector, said first audio connector connected to transmit said demodulated audio to said power amplifier.

27. The method for optically preamplifying at least one audio signal of claim 24 wherein converting said attenuated modulated light signal is accomplished by a second signal converter.

28. The method for optically preamplifying at least one audio signal of claim 24 further comprising the steps of:

receiving a second selection signal that selects which of said second signal converters to which said attenuated modulated light signals from said fiber optic volume control device is to be transferred; and transferring said attenuated modulated light signal to a selected second signal converter based on said second selection signal.

29. The method for optically preamplifying at least one audio signal of claim 28 further comprising the step of:

generating said attenuation factor, said first selection signal for selecting said modulated signals, said second selection signal for selecting said second converter to which said attenuated modulated light signal is to be transferred.

30. The method for optically preamplifying at least one audio signal of claim 25 wherein said first audio connector is selected from a set of audio connectors consisting of an RCA audio connector, a BNC coaxial connector, and an XLR audio connector.

31. The method for optically preamplifying at least one audio signal of claim 26 wherein said second audio connector is selected from a set of audio connectors consisting of an RCA audio connector, a BNC coaxial connector, and an XLR audio connector.

32. The method for optically preamplifying at least one audio signal of claim 24 wherein converting each of said audio signals to modulated light signals is accomplished by a first signal converter, wherein said first signal converter comprises:

a modulator that receives said audio signal and converts it to a conversion current proportional to said analog signal; and an electron-to-light converter in communication with the modulator to receive said conversion current to generate said modulated light signal.

33. The method for optically preamplifying at least one audio signal of claim 32 wherein said electron-to-light converter is a light emitting diode or a laser diode.

34. The method for optically preamplifying at least one audio signal of claim 27 wherein said second signal converter comprises:

a light-to-electron converter to receive said attenuated modulated light signal and convert said attenuated modulated light signal to a current that varies with said modulated carrier signal;

a demodulator in communication with the light-to-electron converter to receive said current, said demodulator removing said carrier signal to reconvert said audio signal for transfer to said power amplifier.

35. The method for optically preamplifying at least one audio signal of claim 34 wherein the light-to-electron converter is selected from the group of light-to-electron converters consisting of photoresistors, phototransistors, and photodiodes.

* * * * *